(12) United States Patent
Koo

(10) Patent No.: US 10,553,267 B2
(45) Date of Patent: Feb. 4, 2020

(54) SEMICONDUCTOR DEVICE FOR INITIALIZING MEMORY CELLS

(71) Applicant: SK hynix Inc., Icheon-si Gyeonggi-do (KR)

(72) Inventor: Kibong Koo, Yongin-si Gyeonggi-do (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 0 days.

(21) Appl. No.: 15/852,541

(22) Filed: Dec. 22, 2017

(65) Prior Publication Data

US 2019/0043546 A1    Feb. 7, 2019

(30) Foreign Application Priority Data

Aug. 4, 2017    (KR) .................. 10-2017-0099124

(51) Int. Cl.
| | |
|---|---|
| *G11C 8/18* | (2006.01) |
| *G11C 16/34* | (2006.01) |
| *G11C 29/10* | (2006.01) |
| *G11C 29/20* | (2006.01) |
| *G11C 7/12* | (2006.01) |
| *G11C 8/10* | (2006.01) |
| *G11C 16/08* | (2006.01) |
| *G11C 5/14* | (2006.01) |
| *G11C 7/06* | (2006.01) |

(Continued)

(52) U.S. Cl.
CPC ............... *G11C 8/18* (2013.01); *G11C 5/14* (2013.01); *G11C 7/06* (2013.01); *G11C 7/12* (2013.01); *G11C 8/10* (2013.01); *G11C 16/08* (2013.01); *G11C 16/3427* (2013.01); *G11C 29/10* (2013.01); *G11C 29/20* (2013.01); *G11C 29/36* (2013.01); *G11C 29/026* (2013.01)

(58) Field of Classification Search
CPC ....... G11C 7/12; G11C 7/1048; G11C 7/1045; G11C 8/10; G11C 8/08; G11C 16/08; G11C 11/4085; G11C 11/4087; G11C 11/4091; G11C 11/401
USPC ... 365/189.09, 189.011, 189.16, 203, 233.14
See application file for complete search history.

(56) References Cited

U.S. PATENT DOCUMENTS

| | | | | |
|---|---|---|---|---|
| 2006/0256642 | A1* | 11/2006 | Ikeda | G11C 7/1018 365/230.06 |
| 2009/0141570 | A1* | 6/2009 | Hsu | G11C 7/1048 365/191 |
| 2016/0225416 | A1 | 8/2016 | Goto | |

FOREIGN PATENT DOCUMENTS

KR    1020080062719 A    7/2008

* cited by examiner

*Primary Examiner* — Alfredo Bermudez Lozada
(74) *Attorney, Agent, or Firm* — William Park & Associates Ltd.

(57) ABSTRACT

A semiconductor device may include a power supply circuit, a word line control circuit, and a memory circuit. The power supply circuit may drive a pre-charge voltage to a level of an external voltage based on a write initialization signal which is enabled if a command has a predetermined level combination. The word line control circuit may generates two or more word line selection signals that are sequentially counted based on the write initialization signal. The memory circuit may sequentially select a plurality of word lines based on the word line selection signals. The memory circuit may drive bit lines of memory cells connected to the selected word line to the pre-charge voltage. The memory circuit may (Continued)

store data, which are loaded on the bit lines to have a level of the pre-charge voltage, into the memory cells connected to the selected word line.

8 Claims, 10 Drawing Sheets

(51) Int. Cl.
*G11C 29/36* (2006.01)
*G11C 29/02* (2006.01)

US 10,553,267 B2

SEMICONDUCTOR DEVICE FOR INITIALIZING MEMORY CELLS

CROSS-REFERENCE TO RELATED APPLICATION

The present application claims priority under 35 U.S.C 119(a) to Korean Application No. 10-2017-0099124, filed on Aug. 4, 2017, which is incorporated herein by reference in its entirety.

BACKGROUND

1. Technical Field

Embodiments of the present disclosure may generally relate to semiconductor devices and, more particularly, to semiconductor devices relating to an initialization operation of memory cells.

2. Related Art

Internal set values of a semiconductor device have to be initialized to set initial values before the semiconductor device operates. Thus, an initialization operation of the semiconductor device may be very important to allow for normal operations of the semiconductor device to be performed.

A chip such as the semiconductor device having various functions may include a plurality of circuits, initial conditions of which are necessarily set to perform the correct active operations. The initialization operation for setting the initial conditions has to be performed before the active operations of the chip are performed.

In addition, the semiconductor device may store data or may output the stored data according to an operation mode. For example, if a controller wants access to data stored in the semiconductor device, the semiconductor device may perform a read operation to output the data stored in memory cells corresponding to an address received from the controller. In contrast, if the controller wants to store data into the semiconductor device, the semiconductor device may perform a write operation to store the data into the memory cells corresponding to an address received from the controller.

SUMMARY

According to an embodiment, a semiconductor device may be provided. The semiconductor device may include a power supply circuit, a word line control circuit, and a memory circuit. The power supply circuit may be configured to drive a pre-charge voltage to a level of an external voltage based on a write initialization signal which is enabled if a command has a predetermined level combination. The word line control circuit may be configured to generate two or more word line selection signals that may be sequentially counted based on the write initialization signal. The memory circuit may be configured to sequentially select a plurality of word lines based on the word line selection signals. The memory circuit may be configured to drive bit lines of memory cells connected to the selected word line to the pre-charge voltage. The memory circuit may be configured to store data, which are loaded on the bit lines to have a level of the pre-charge voltage, into the memory cells connected to the selected word line.

According to an embodiment, a semiconductor device may be provided. The semiconductor device may include a power supply circuit, a word line control circuit, and a memory circuit. The power supply circuit may be configured to drive a first pre-charge voltage to a level of a first external voltage and drive a second pre-charge voltage to a level of a second external voltage, based on a write initialization signal which is enabled if a command has a predetermined level combination. The word line control circuit may be configured to generate two or more word line selection signals that may be sequentially counted based on the write initialization signal. The memory circuit may be configured to sequentially select a plurality of word lines based on the word line selection signals. The memory circuit may be configured to drive a first bit line of a first memory cell connected to the selected word line to a level of the first pre-charge voltage and drive a second bit line of a second memory cell connected to the selected word line to a level of the second pre-charge voltage. The memory circuit may be configured to store a datum, which is loaded on the first bit line to have a level of the first pre-charge voltage, into the first memory cell and store a datum, which is loaded on the second bit line to have a level of the second pre-charge voltage, into the second memory cell.

DETAILED DESCRIPTION

Various embodiments of the present disclosure will be described hereinafter with reference to the accompanying drawings. However, the embodiments described herein are for illustrative purposes only and are not intended to limit the scope of the present disclosure.

For reference, an embodiment including additional components may be provided. Furthermore, a logic high or logic low configuration indicating an active state of a signal or circuit may be changed depending on embodiments. Furthermore, the configuration of a transistor required for implementing the same function may be modified. That is, the configuration of the PMOS transistor and the configuration of the NMOS transistor may be replaced with each other, depending on a specific situation. If necessary, various transistors may be applied to implement the configurations.

Further, the logic levels of the signals may be different from or the opposite of those described. For example, a signal described as having a logic "high" level may alternatively have a logic "low" level, and a signal described as having a logic "low" level may alternatively have a logic "high" level.

Figure 1:
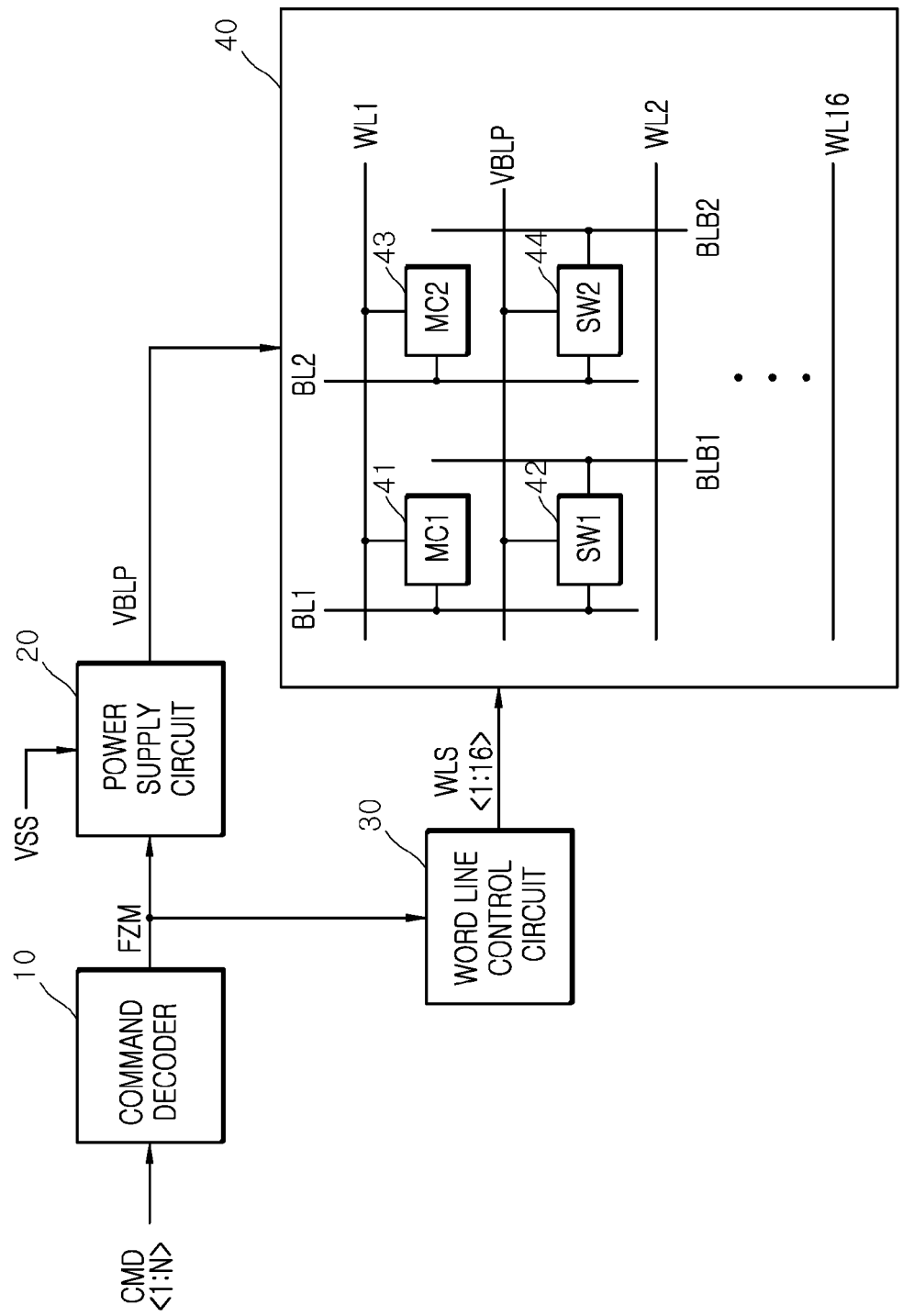
FIG. 1 is a block diagram illustrating a configuration of a semiconductor device according to an embodiment of the present disclosure.

Referring to FIG. 1, a semiconductor system according to an embodiment may include a command decoder 10, a power supply circuit 20, a word line control circuit 30, and a memory circuit 40.

The command decoder 10 may decode a command CMD<1:N> to generate a write initialization signal FZM. The command decoder 10 may generate the write initialization signal FZM which is enabled if the command CMD<1:N> has a predetermined level combination. The command CMD<1:N> may be transmitted through lines that transmit at least one group of addresses, commands and data. The number "N" of bits included in the command CMD<1:N> may be set to be different according to the embodiments. The command CMD<1:N> may be provided by a controller controlling the semiconductor device or a test apparatus for testing the semiconductor device to extract various characteristics (e.g., some electrical parameters) of the semiconductor device. The write initialization signal FZM may be a signal activating an initialization operation for writing data having an external voltage level into a plurality of memory cells included in the memory circuit 40.

The power supply circuit 20 may drive a pre-charge voltage VBLP to a level of a ground voltage VSS in response to the write initialization signal FZM. The power supply circuit 20 may drive the pre-charge voltage VBLP to a level of the ground voltage VSS if the write initialization signal FZM is enabled. The power supply circuit 20 may generate the pre-charge voltage VBLP having the ground voltage VSS in response to the write initialization signal FZM. The power supply circuit 20 may supply the pre-charge voltage VBLP having the ground voltage VSS to the memory circuit 40. The ground voltage VSS may be an external voltage provided by an external device. In some other embodiments, the power supply circuit 20 may be realized to generate the pre-charge voltage VBLP having a level of a power supply voltage VDD.

The word line control circuit 30 may generate a word line selection signal including first to sixteenth word line selection signals WLS<1:16> which are sequentially counted in response to the write initialization signal FZM. The word line control circuit 30 may generate the word line selection signals WLS<1:16> which are sequentially counted if the write initialization signal FZM is enabled. The number of bits allocated for the word line selection signals WLS<1:16> may be set to be equal to the number of word lines WL<1:16> included in the memory circuit 40. A time it takes to count all of the word line selection signals WLS<1:16> one time may be set to be a sum of an active period and a pre-charge period.

The memory circuit 40 may include a plurality of memory cells 41 and 43 and a plurality of switch circuits 42 and 44. The memory circuit 40 may further include the plurality of word lines WL<1:16>, a plurality of bit lines BL1 and BL2, and a plurality of complementary bit lines BLB1 and BLB2. The plurality of switch circuits 42 and 44 may apply the pre-charge voltage VBLP to the plurality of bit lines BL1 and BL2 and the plurality of complementary bit lines BLB1 and BLB2 in response to an equalization signal (VBLEQ of FIG. 5) which is enabled during a pre-charge operation. The memory circuit 40 may drive the bit lines BL1 and BL2 and the complementary bit lines BLB1 and BLB2 coupled to memory cells connected to any one of the word lines WL<1:16>, which are selected in response to the word line selection signals WLS<1:16>, to the pre-charge voltage VBLP. For example, in an embodiment, the word line WL1 may be selected in response to the word line selection signal WLS1, the word line WL2 may be selected in response to the word line selection signal WLS2, the word line WL3 may be selected in response to the word line selection signal WLS3, the word line WL4 may be selected in response to the word line selection signal WLS4, the word line WL5 may be selected in response to the word line selection signal WLS5, the word line WL6 may be selected in response to the word line selection signal WLS6, the word line WL7 may be selected in response to the word line selection signal WLS7, the word line WL8 may be selected in response to the word line selection signal WLS8, the word line WL9 may be selected in response to the word line selection signal WLS9, the word line WL10 may be selected in response to the word line selection signal WLS10, the word line WL11 may be selected in response to the word line selection signal WLS11, the word line WL12 may be selected in response to the word line selection signal WLS12, the word line WL13 may be selected in response to the word line selection signal WLS13, the word line WL14 may be selected in response to the word line selection signal WLS14, the word line WL15 may be selected in response to the word line selection signal WLS15, the word line WL16 may be selected in response to the word line selection signal WLS16. The memory circuit 40 may store data (having a level of the pre-charge voltage VBLP) loaded on the bit lines BL1 and BL2 into the memory cells 41 and 43 if the write initialization signal FZM is enabled. The number of the memory cells 41 and 43 and the number of the switch circuits 42 and 44 may be set to be different according to the embodiments.

Figure 2:
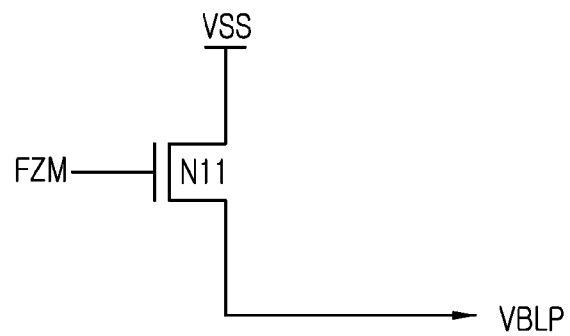
FIG. 2 is a circuit diagram illustrating a configuration of a power supply circuit included in the semiconductor device of FIG. 1.

Referring to FIG. 2, the power supply circuit 20 may be realized using an NMOS transistor N11.

The power supply circuit 20 may drive the pre-charge voltage VBLP to the ground voltage VSS if the write initialization signal FZM is enabled to have a logic "high" level. The NMOS transistor N11 of the power supply circuit 20 may be turned on to generate the pre-charge voltage VBLP having the ground voltage VSS if the write initialization signal FZM is enabled to have a logic "high" level.

Figure 3:
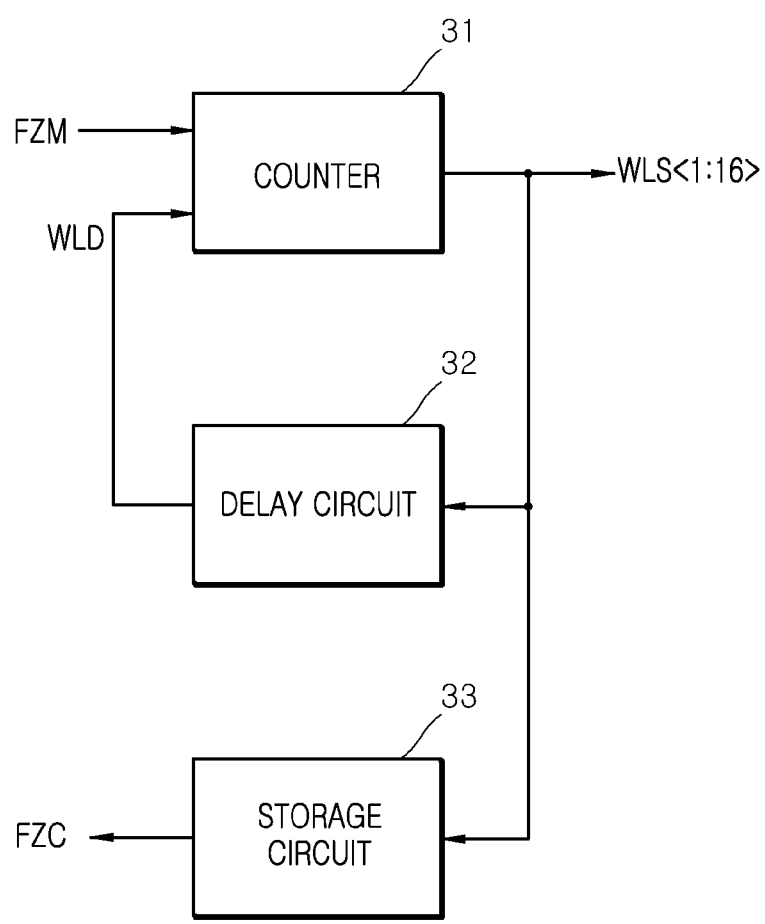
FIG. 3 is a block diagram illustrating a configuration of a word line control circuit included in the semiconductor device of FIG. 1.

Referring to FIG. 3, the word line control circuit 30 may include a counter 31, a delay circuit 32, and a storage circuit 33.

The counter 31 may generate the word line selection signals WLS<1:16> which are sequentially counted in response to the write initialization signal FZM and a word line delay signal WLD. The counter 31 may generate the word line selection signals WLS<1:16> which are sequentially counted in response to the word line delay signal WLD if the write initialization signal FZM is enabled. The counter 31 may generate the word line selection signals WLS<1:16> which are sequentially counted if the write initialization signal FZM is enabled and a pulse of the word line delay signal WLD is inputted to the counter 31.

The delay circuit 32 may delay a selected one of the word line selection signals WLS<1:16> by a sum of the active period and the pre-charge period to generate the word line delay signal WLD. The delay circuit 32 may delay any one of the first to sixteenth word line selection signals WLS<1:16>, which is selectively enabled, by a sum of the active period and the pre-charge period to generate the word line delay signal WLD. The active period may be set to be a time period for activating all of the word line selection signals WLS<1:16>. The pre-charge period may be set to be a time period for driving the bit lines BL1 and BL2 and the complementary bit lines BLB1 and BLB2 to have the pre-charge voltage VBLP.

The storage circuit 33 may store an initialization end signal FZC which is enabled after all of the word line selection signals WLS<1:16> are sequentially counted once. The storage circuit 33 may store the initialization end signal FZC which is enabled if the sixteenth word line selection signal WLS<16> among the first to sixteenth word line selection signals WLS<1:16> is enabled. The storage circuit 33 may output the initialization end signal FZC stored therein.

Figure 4:
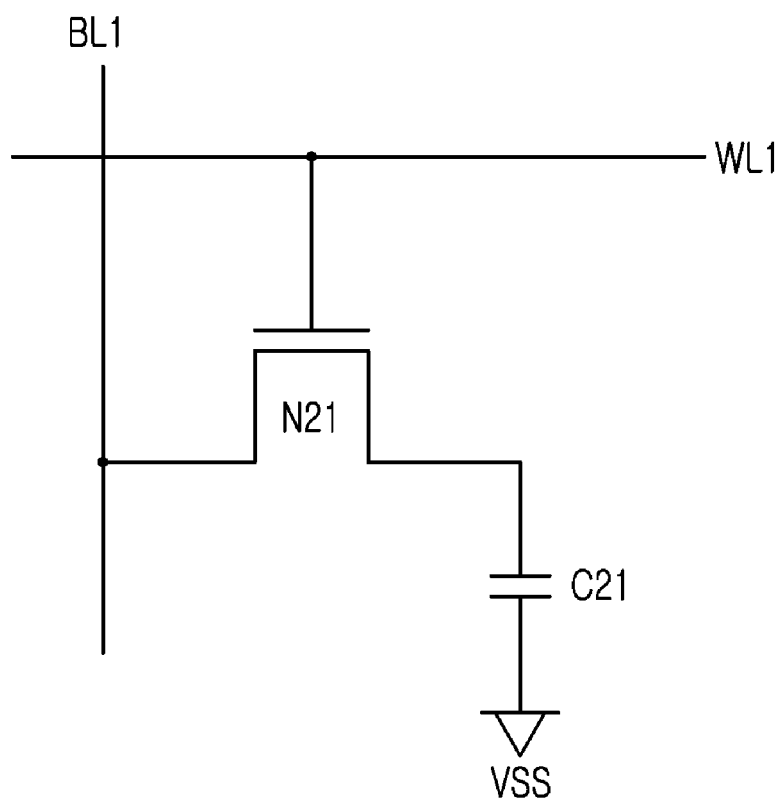
FIG. 4 is a circuit diagram illustrating a configuration of a first memory cell included in the semiconductor device of FIG. 1.

Referring to FIG. 4, the memory cell 41 may include an NMOS transistor N21 and a capacitor C21.

The NMOS transistor N21 may have a gate connected to the first word line WL1, a drain (or a source) connected to the first bit line BL1, and a source (or a drain) connected to a terminal of the capacitor C21. The NMOS transistor N21 may be turned on to electrically connect the first bit line BL1 to the capacitor C21 if the first word line WL1 is selected and activated.

The capacitor C21 may be coupled between the NMOS transistor N21 and a ground voltage VSS terminal to store a datum loaded on the first bit line BL1.

The memory cell 43 illustrated in FIG. 1 may be realized to have the same configuration as the memory cell 41 illustrated in FIG. 4. That is, the memory cell 43 may perform substantially the same operation as the memory cell 41. Thus, a detailed description of the memory cell 43 will be omitted hereinafter.

A configuration of the first switch circuit 42 and a configuration of the second switch circuit 44 will be described hereinafter with reference to FIG. 5.

The first switch circuit 42 may include a first equalization circuit 110 and a first sense amplifier 120.

The first equalization circuit 110 may be realized using NMOS transistors N31, N32, and N33. The NMOS transistors N31, N32, and N33 of the first equalization circuit 110 may be turned on in response to the equalization signal VBLEQ which is enabled during the pre-charge period. The NMOS transistors N31, N32, and N33 of the first equalization circuit 110 may be turned on to apply the pre-charge voltage VBLP to the first bit line BL1 and the first complementary bit line BLB1 if the equalization signal VBLEQ is enabled to have a logic "high" level. The first equalization circuit 110 may drive the first bit line BL1 and the first complementary bit line BLB1 to have the same voltage level.

The first sense amplifier 120 may sense and amplify a voltage difference between the first bit line BL1 and the first complementary bit line BLB1.

As described above, the first switch circuit 42 may electrically connect the first bit line BL1 and the first complementary bit line BLB1 to each other in response to the equalization signal VBLEQ. The first switch circuit 42 may apply the pre-charge voltage VBLP to the first bit line BL1 and the first complementary bit line BLB1.

The second switch circuit 44 may include a second equalization circuit 130 and a second sense amplifier 140.

The second equalization circuit 130 may be realized using NMOS transistors N34, N35, and N36. The NMOS transistors N34, N35, and N36 of the second equalization circuit 130 may be turned on in response to the equalization signal VBLEQ which is enabled during the pre-charge period. The NMOS transistors N34, N35, and N36 of the second equalization circuit 130 may be turned on to apply the pre-charge voltage VBLP to the second bit line BL2 and the second complementary bit line BLB2 if the equalization signal VBLEQ is enabled to have a logic "high" level. The second equalization circuit 130 may drive the second bit line BL2 and the second complementary bit line BLB2 to have the same voltage level.

The second sense amplifier 140 may sense and amplify a voltage difference between the second bit line BL2 and the second complementary bit line BLB2.

As described above, the second switch circuit 44 may electrically connect the second bit line BL2 and the second complementary bit line BLB2 to each other in response to the equalization signal VBLEQ. The second switch circuit 44 may apply the pre-charge voltage VBLP to the second bit line BL2 and the second complementary bit line BLB2.

Figure 6:
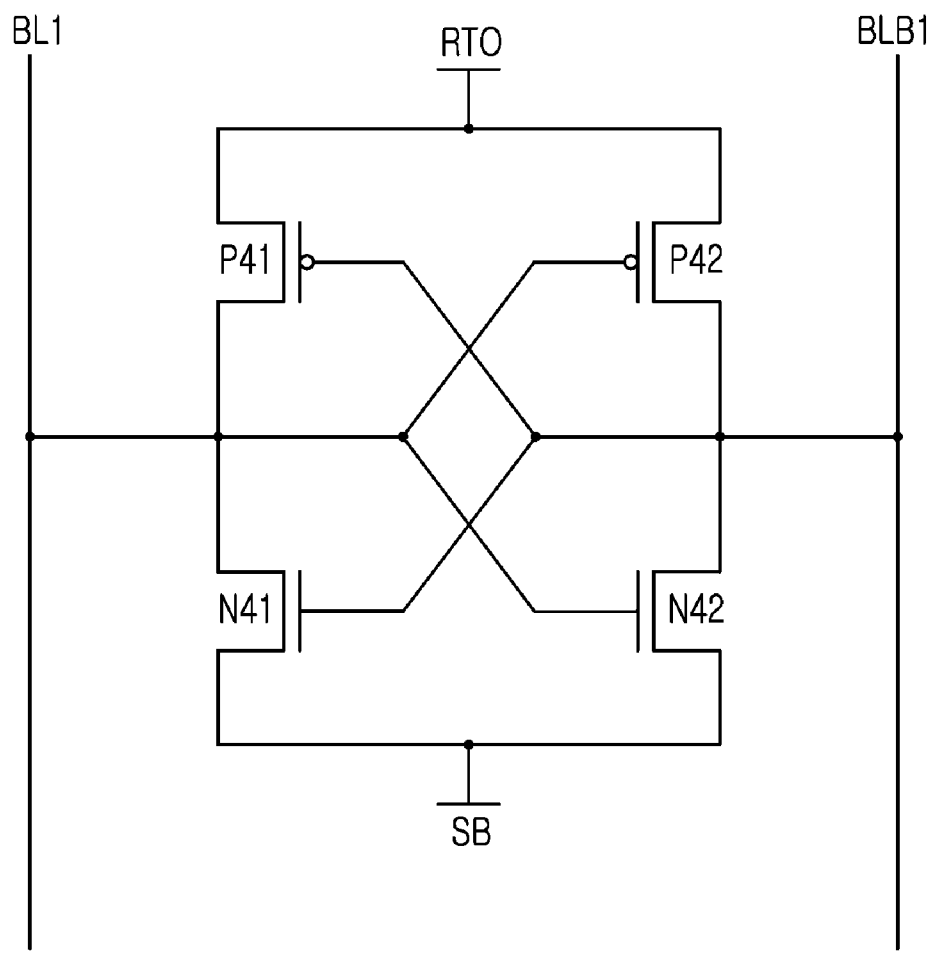
FIG. 6 is a circuit diagram illustrating a configuration of a configuration of a first sense amplifier included in the first switch circuit of FIG. 5.

Referring to FIG. 6, the first sense amplifier 120 may be realized using PMOS transistors P41 and P42 and NMOS transistors N41 and N42. The first sense amplifier 120 may sense a voltage difference between the first bit line BL1 and the first complementary bit line BLB1 and may amplify the voltage difference between the first bit line BL1 and the first complementary bit line BLB1 so that the first bit line BL1 and the first complementary bit line BLB1 have a voltage difference between a first voltage RTO and a second voltage SB. The first voltage RTO may be a voltage for setting a voltage level corresponding to a logic "high" level, and the second voltage SB may be a voltage for setting a voltage level corresponding to a logic "low" level.

Figure 5:
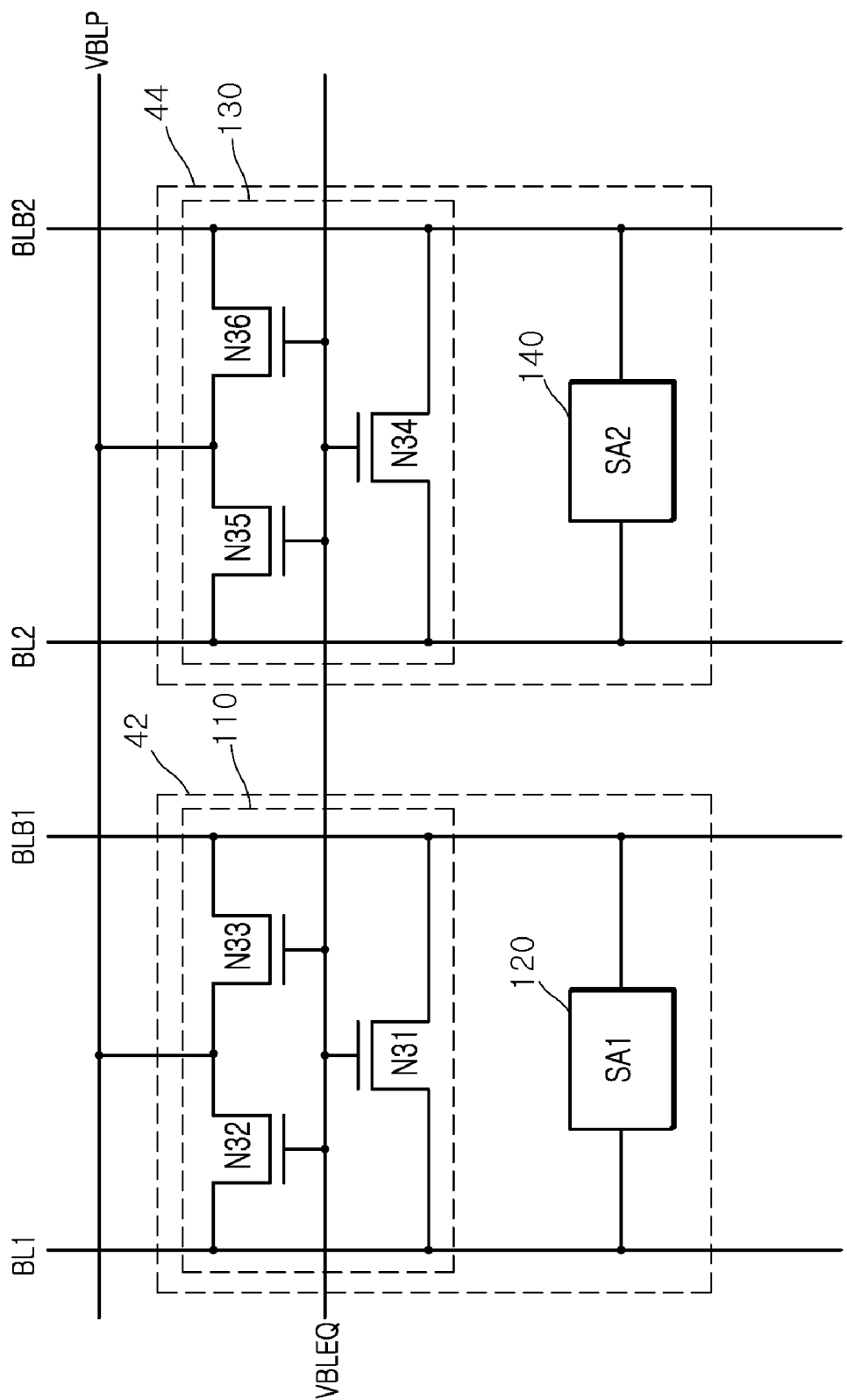
FIG. 5 is a circuit diagram illustrating a configuration of a first switch circuit and a second switch circuit included in the semiconductor device of FIG. 1.

The second sense amplifier 140 illustrated in FIG. 5 may be realized to have substantially the same circuit as the first sense amplifier 120 illustrated in FIG. 6. That is, the second sense amplifier 140 may perform the same operation as the first sense amplifier 120. Thus, a description of the second sense amplifier 140 will be omitted hereinafter.

Figure 7:
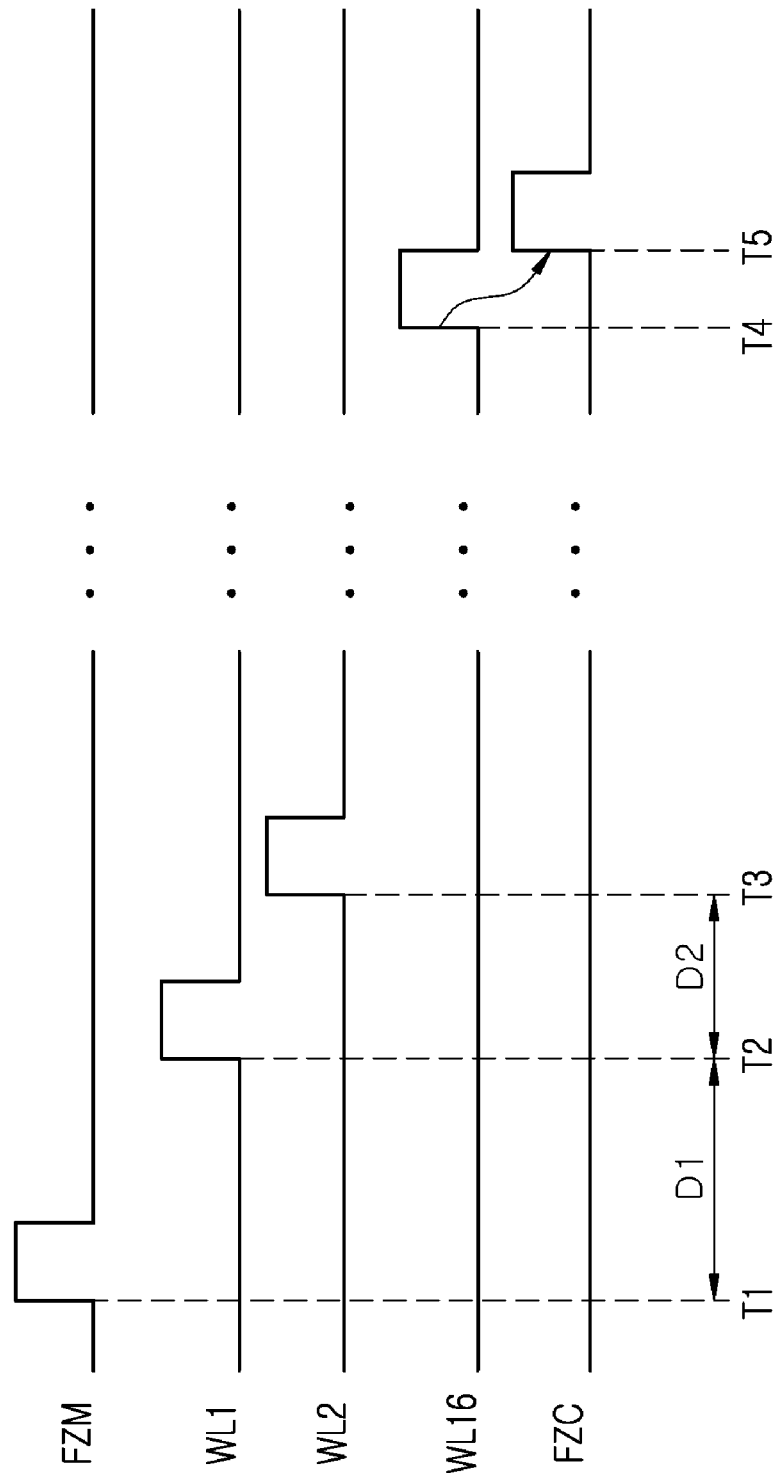
FIG. 7 is a timing diagram illustrating operations of semiconductor devices according to some embodiments of the present disclosure.

The initialization operation performed in the semiconductor device of FIG. 1 to drive the pre-charge voltage to an external voltage and to initialize memory cells by storing data having a level of the pre-charge voltage into the memory cells will be described hereinafter with reference to FIG. 7.

At a point of time "T1", the command decoder 10 may decode the command CMD<1:N> having a predetermined level combination to generate the write initialization signal FZM which is enabled to have a logic "high" level.

The NMOS transistor N11 of the power supply circuit 20 may be turned on in response to the write initialization signal FZM having a logic "high" level to generate the pre-charge voltage VBLP having the ground voltage VSS.

A first period D1 from the point of time "T1" till a point of time "T2" may be set as a time period for driving the pre-charge voltage VBLP to the ground voltage VSS.

At the point of time "T2", the counter 31 of the word line control circuit 30 may generate the first word line selection signal WLS<1> having a logic "high" level in response to the write initialization signal FZM having a logic "high" level.

The memory circuit 40 may activate the first word line WL<1> which is selected in response to the first word line selection signal WLS<1> having a logic "high" level. The memory circuit 40 may drive the bit lines BL1 and BL2 and the complementary bit lines BLB1 and BLB2, which are coupled to the memory cells 41 and 43 connected to the first word line WL<1>, to the pre-charge voltage VBLP. The memory circuit 40 may store data (having a level of the pre-charge voltage VBLP) loaded on the bit lines BL1 and BL2 into the memory cells 41 and 43. In such a case, the data stored in the memory cells 41 and 43 may have the ground voltage VSS which means a logic "low" level.

At a point of time "T3", the delay circuit 32 of the word line control circuit 30 may delay the first word line selection signal WLS<1> by a sum of the active period and the pre-charge period to generate the word line delay signal WLD.

The counter 31 of the word line control circuit 30 may generate the second word line selection signal WLS<2> having a logic "high" level in response to the word line delay signal WLD having a logic "high" level.

The memory circuit 40 may activate the second word line WL<2> which is selected in response to the second word line selection signal WLS<2> having a logic "high" level. The memory circuit 40 may drive the bit lines BL1 and BL2 and the complementary bit lines BLB1 and BLB2, which are coupled to memory cells (not illustrated) connected to and selected by the second word line WL<2>, to the pre-charge voltage VBLP. The memory circuit 40 may store data (having a level of the pre-charge voltage VBLP) loaded on the bit lines BL1 and BL2 into the selected memory cells (not illustrated). In such a case, the data stored in the selected memory cells (not illustrated) may have the ground voltage VSS which means a logic "low" level.

A second period D2 from the point of time "T2" till the point of time "T3" may be set to correspond to a sum of the active period and the pre-charge period.

During a period from the point of time "T3" till a point of time "T4", the counter 31 of the word line control circuit 30 may sequentially count the third to sixteenth word line selection signals WLS<3:16>.

At the point of time "T4", the memory circuit 40 may activate the sixteenth word line WL<16> which is selected in response to the sixteenth word line selection signal WLS<16> having a logic "high" level. The memory circuit 40 may drive the bit lines BL1 and BL2 and the complementary bit lines BLB1 and BLB2, which are coupled to memory cells (not illustrated) connected to and selected by the sixteenth word line WL<16>, to the pre-charge voltage VBLP. The memory circuit 40 may store data (having a level of the pre-charge voltage VBLP) loaded on the bit lines BL1 and BL2 into the selected memory cells (not illustrated). In such a case, the data stored in the selected memory cells (not illustrated) may have the ground voltage VSS which means a logic "low" level.

At a point of time "T5", the storage circuit 33 of the word line control circuit 30 may store the initialization end signal FZC which is enabled to have a logic "high" level after the sixteenth word line selection signal WLS<16> is counted. The storage circuit 33 of the word line control circuit 30 may output the initialization end signal FZC stored therein.

As described above, a semiconductor device according to an embodiment may drive a pre-charge voltage to an external voltage during an initialization operation and may store data having a level of the pre-charge voltage into all of memory cells to initialize the memory cells.

Figure 8:
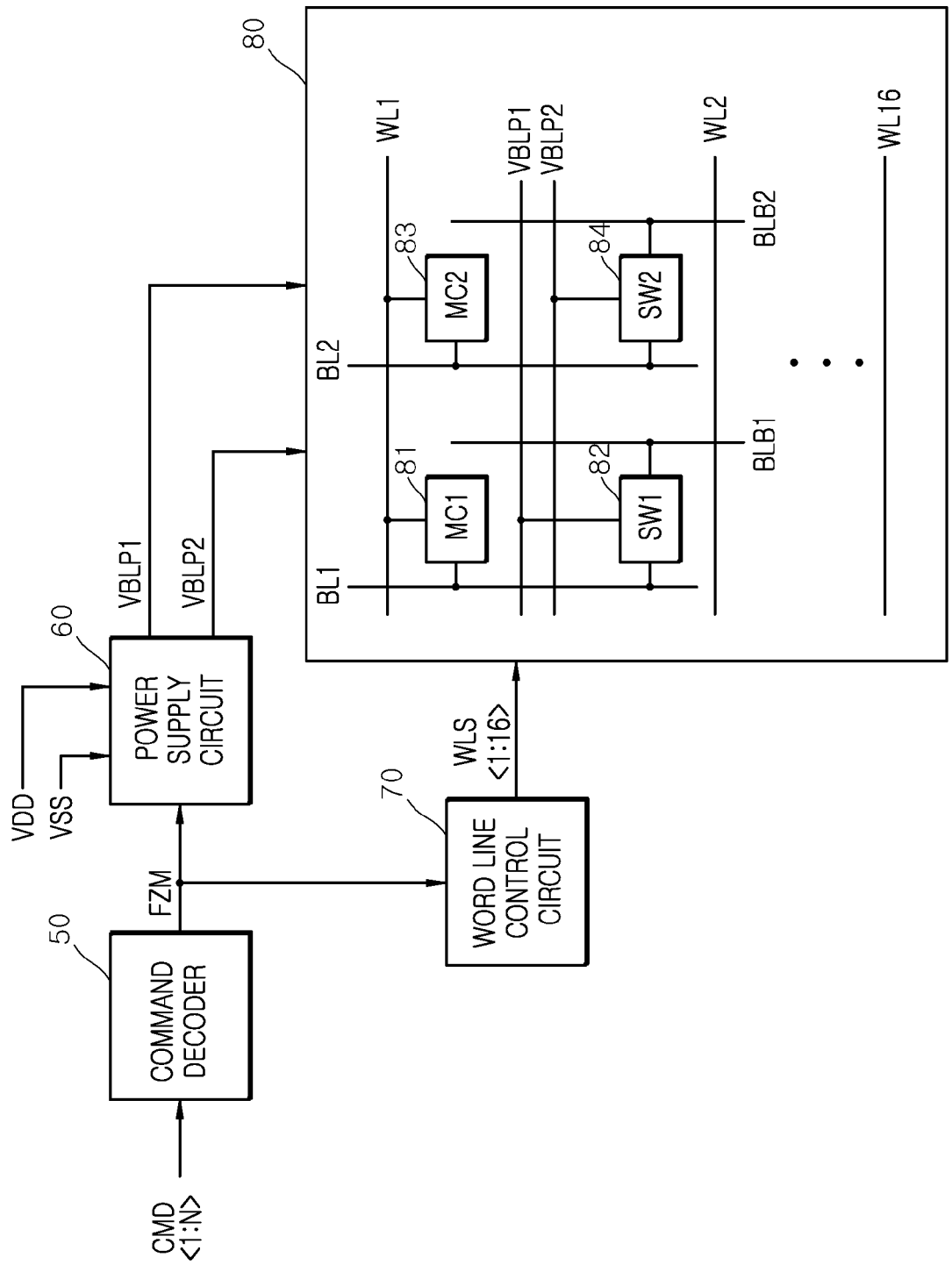
FIG. 8 is a block diagram illustrating a configuration of a semiconductor device according to an embodiment of the present disclosure.

Referring to FIG. 8, a semiconductor device according to an embodiment may include a command decoder 50, a power supply circuit 60, a word line control circuit 70 and a memory circuit 80.

The command decoder 50 may decode a command CMD<1:N> to generate a write initialization signal FZM. The command decoder 10 may generate the write initialization signal FZM which is enabled if the command CMD<1:N> has a predetermined level combination. The command CMD<1:N> may be transmitted through lines that transmit at least one group of addresses, commands and data. The number "N" of bits included in the command CMD<1:N> may be set to be different according to the embodiments. The command CMD<1:N> may be provided by a controller controlling the semiconductor device or a test apparatus for testing the semiconductor device to extract various characteristics (e.g., some electrical parameters) of the semiconductor device. The write initialization signal FZM may be a signal activating an initialization operation for writing data having an external voltage level into a plurality of memory cells included in the memory circuit 80. The command decoder 50 may be realized to have substantially the same configuration and function as the command decoder 10 described with reference to FIG. 1.

The power supply circuit 60 may drive a first pre-charge voltage VBLP1 to a level of a ground voltage VSS in response to the write initialization signal FZM. The power supply circuit 60 may drive a second pre-charge voltage VBLP2 to a level of a power supply voltage VDD in response to the write initialization signal FZM. The power supply circuit 60 may drive the first pre-charge voltage VBLP1 to a level of the ground voltage VSS if the write initialization signal FZM is enabled. The power supply circuit 60 may drive the second pre-charge voltage VBLP2 to a level of the power supply voltage VDD if the write initialization signal FZM is enabled. The power supply circuit 60 may generate the first pre-charge voltage VBLP1 having the ground voltage VSS in response to the write initialization signal FZM. The power supply circuit 60 may generate the second pre-charge voltage VBLP2 having the power supply voltage VDD in response to the write initialization signal FZM. The power supply circuit 60 may supply the first pre-charge voltage VBLP1 having the ground voltage VSS to the memory circuit 80. The power supply circuit 60 may supply the second pre-charge voltage VBLP2 having the power supply voltage VDD to the memory circuit 80. The ground voltage VSS and the power supply voltage VDD may be external voltages provided by an external device.

The word line control circuit 70 may generate a word line selection signal including first to sixteenth word line selection signals WLS<1:16> which are sequentially counted in response to the write initialization signal FZM. The word line control circuit 70 may generate the word line selection signals WLS<1:16> which are sequentially counted if the write initialization signal FZM is enabled. The number of bits allocated for the word line selection signals WLS<1:16> may be set to be equal to the number of word lines WL<1:16> included in the memory circuit 80. A time it takes count all of the word line selection signals WLS<1:16> one time may be set to be a sum of an active period and a pre-charge period. The word line control circuit 70 may be realized to have substantially the same configuration and function as the word line control circuit 30 described with reference to FIG. 3.

The memory circuit 80 may include a plurality of memory cells 81 and 83 and a plurality of switch circuits 82 and 84. The memory circuit 80 may further include the plurality of word lines WL<1:16>, a plurality of bit lines BL1 and BL2, and a plurality of complementary bit lines BLB1 and BLB2. The switch circuit 82 may apply the first pre-charge voltage VBLP1 to the first bit line BL1 and the first complementary bit line BLB1 in response to an equalization signal (VBLEQ of FIG. 10) which is enabled during a pre-charge operation. The switch circuit 84 may apply the second pre-charge voltage VBLP2 to the second bit line BL2 and the second complementary bit line BLB2 in response to the equalization signal (VBLEQ of FIG. 10) which is enabled during the pre-charge operation. The memory circuit 80 may drive the first bit line BL1 and the first complementary bit line BLB1 coupled to the first memory cell 81 connected to any one of the word lines WL<1:16>, which are selected in response to the word line selection signals WLS<1:16>, to the first pre-charge voltage VBLP1. The memory circuit 80 may drive the second bit line BL2 and the second complementary bit line BLB2 coupled to the second memory cell 83 connected to any one of the word lines WL<1:16>, which are selected in response to the word line selection signals WLS<1:16>, to the second pre-charge voltage VBLP2. The memory circuit 80 may store a datum (having a level of the first pre-charge voltage VBLP1) loaded on the first bit line BL1 into the first memory cell 81. The memory circuit 80 may store a datum (having a level of the second pre-charge voltage VBLP2) loaded on the second bit line BL2 into the second memory cell 83. In such a case, the datum stored in the first memory cell 81 may have a logic "low" level, and the datum stored in the second memory cell 83 may have a logic "high" level. That is, the data stored in two adjacent memory cells may have different logic levels. The number of the memory cells 81 and 83 and the number of the switch circuits 82 and 84 may be set to be different according to the embodiments. In an embodiment, for example, memory cells 81 and 83 may be immediately adjacent to each other because the memory cells 81 and 83 are connected to the same word line, for example, the first word line WL1 and are connected to the next adjacent bit line, for example, the next adjacent bit line for the first bit line BL1 attached to the first memory cell 81 is the second bit line BL2 connected to the second memory cell MC2.

Figure 9:
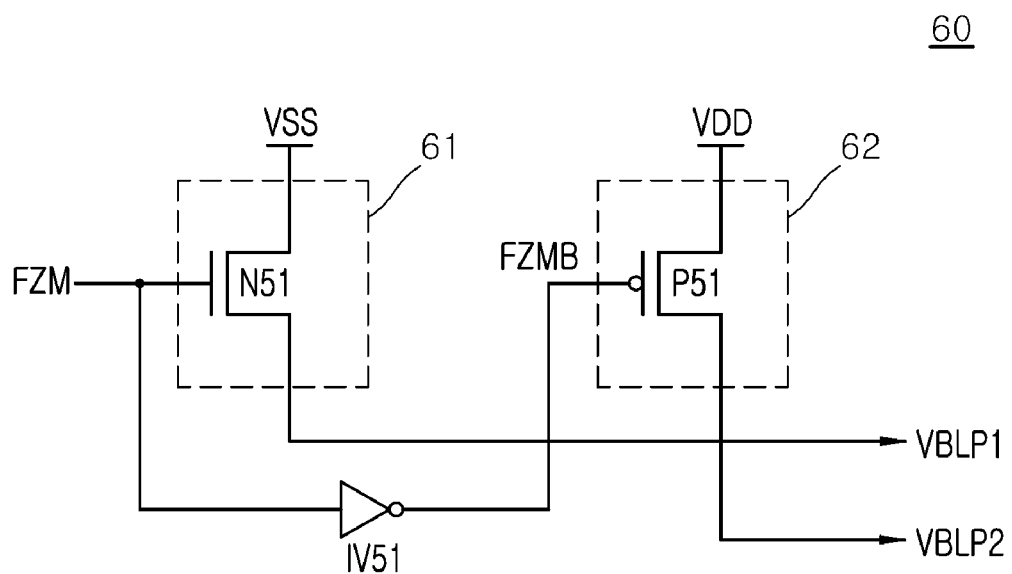
FIG. 9 is a circuit diagram illustrating a configuration of a power supply circuit included in the semiconductor device of FIG. 8.

Referring to FIG. 9, the power supply circuit 60 may include an inverter IV51, a first power supply circuit 61, and a second power supply circuit 62.

The first power supply circuit 61 may be realized using an NMOS transistor N51.

The first power supply circuit 61 may drive the first pre-charge voltage VBLP1 to a level of the ground voltage VSS if the write initialization signal FZM is enabled to have a logic "high" level. The NMOS transistor N51 of the first power supply circuit 61 may be turned on to generate the first pre-charge voltage VBLP1 having a level of the ground voltage VSS if the write initialization signal FZM is enabled to have a logic "high" level.

The inverter IV51 may inversely buffer the write initialization signal FZM to generate a complementary write initialization signal FZMB.

The second power supply circuit 62 may be realized using a PMOS transistor P51.

The second power supply circuit 62 may drive the second pre-charge voltage VBLP2 to a level of the power supply voltage VDD if the complementary write initialization signal FZMB is enabled to have a logic "low" level. The PMOS transistor P51 of the second power supply circuit 62 may be turned on to generate the second pre-charge voltage VBLP2 having a level of the power supply voltage VDD if the complementary write initialization signal FZMB is enabled to have a logic "low" level.

Figure 10:
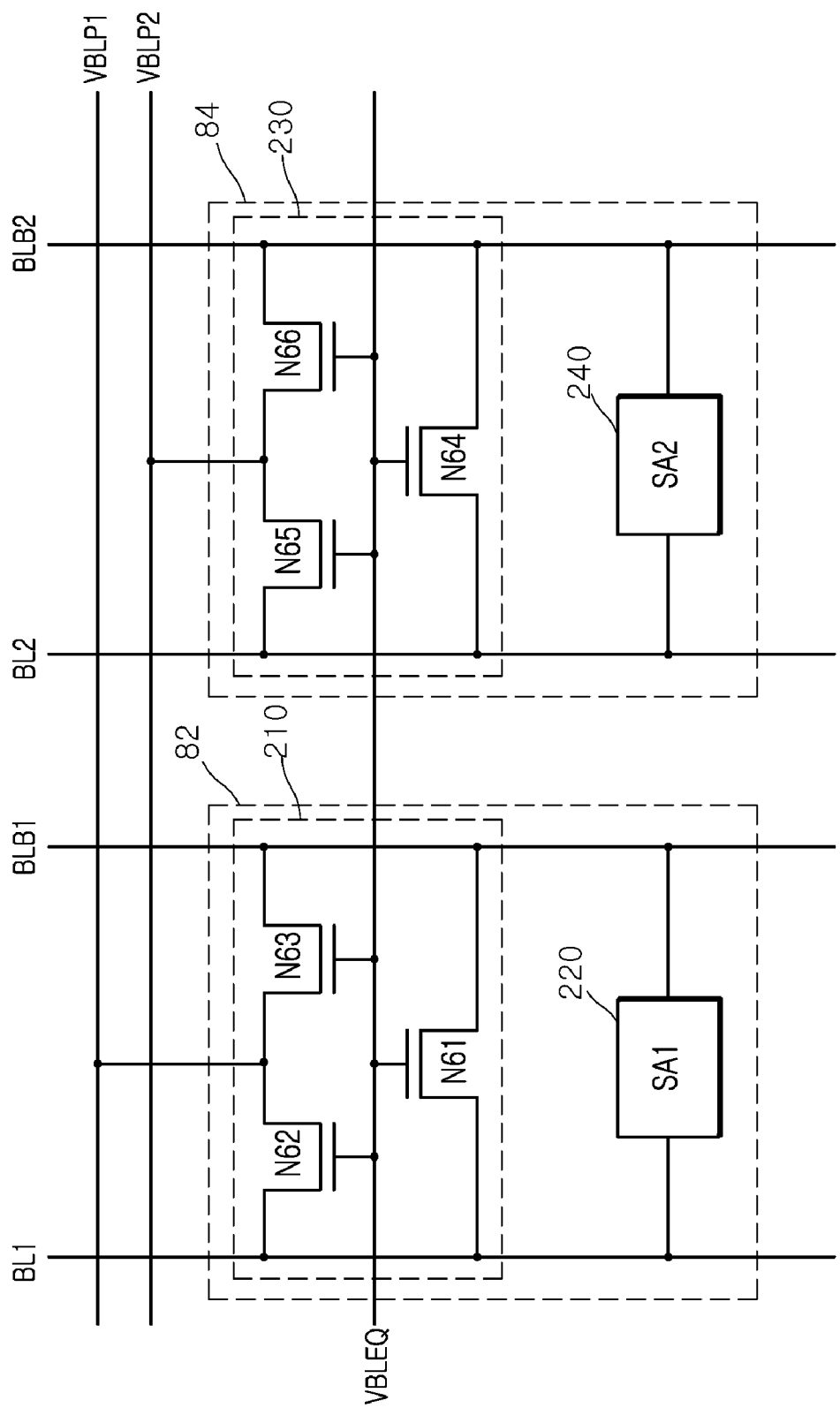
FIG. 10 is a circuit diagram illustrating a configuration of a first switch circuit and a second switch circuit included in the semiconductor device of FIG. 8.

Configurations of the first and second switch circuits 82 and 84 included in the memory circuit 80 will be described hereinafter with reference to FIG. 10.

The first switch circuit 82 may include a first equalization circuit 210 and a first sense amplifier 220.

The first equalization circuit 210 may be realized using NMOS transistors N61, N62, and N63. The NMOS transistors N61, N62, and N63 of the first equalization circuit 210 may be turned on in response to the equalization signal VBLEQ which is enabled during the pre-charge period. The NMOS transistors N61, N62, and N63 of the first equalization circuit 210 may be turned on to apply the first pre-charge voltage VBLP1 to the first bit line BL1 and the first complementary bit line BLB1 if the equalization signal VBLEQ is enabled to have a logic "high" level. The first equalization circuit 210 may drive the first bit line BL1 and the first complementary bit line BLB1 to have the same voltage level.

The first sense amplifier 220 may sense and amplify a voltage difference between the first bit line BL1 and the first complementary bit line BLB1.

As described above, the first switch circuit 82 may electrically connect the first bit line BL1 and the first complementary bit line BLB1 to each other in response to the equalization signal VBLEQ. The first switch circuit 82 may apply the first pre-charge voltage VBLP1 to the first bit line BL1 and the first complementary bit line BLB1.

The second switch circuit 84 may include a second equalization circuit 230 and a second sense amplifier 240.

The second equalization circuit 230 may be realized using NMOS transistors N64, N65, and N66. The NMOS transistors N64, N65, and N66 of the second equalization circuit 230 may be turned on in response to the equalization signal VBLEQ which is enabled during the pre-charge period. The NMOS transistors N64, N65, and N66 of the second equalization circuit 230 may be turned on to apply the second pre-charge voltage VBLP2 to the second bit line BL2 and the second complementary bit line BLB2 if the equalization signal VBLEQ is enabled to have a logic "high" level. The second equalization circuit 230 may drive the second bit line BL2 and the second complementary bit line BLB2 to have the same voltage level.

The second sense amplifier 240 may sense and amplify a voltage difference between the second bit line BL2 and the second complementary bit line BLB2.

As described above, the second switch circuit 84 may electrically connect the second bit line BL2 and the second complementary bit line BLB2 to each other in response to the equalization signal VBLEQ. The second switch circuit 84 may apply the second pre-charge voltage VBLP2 to the second bit line BL2 and the second complementary bit line BLB2.

The initialization operation performed in the semiconductor device of FIG. 8 to respectively drive the first and second pre-charge voltages to first and second external voltages and to respectively store two different data having levels of the first and second pre-charge voltages into two adjacent memory cells for a disturbance test inducing an inter-symbol interference between two different data will be described hereinafter with reference to FIG. 7.

The inter-symbol interference means an undesired phenomenon that two adjacent digital signals having different logic levels interfere with each other to change a logic level of at least one of the two adjacent digital signals. In addition, the disturbance test means a test that senses a level transition of a digital signal which occurs due to the inter-symbol interference.

At the point of time "T1", the command decoder 50 may decode the command CMD<1:N> having a predetermined level combination to generate the write initialization signal FZM which is enabled to have a logic "high" level.

The NMOS transistor N51 of the first power supply circuit 61 may be turned on in response to the write initialization signal FZM having a logic "high" level to generate the first pre-charge voltage VBLP1 having a level of the ground voltage VSS.

The PMOS transistor N51 of the second power supply circuit 62 may be turned on in response to the complementary write initialization signal FZMB having a logic "low" level to generate the second pre-charge voltage VBLP2 having a level of the power supply voltage VDD.

The first period D1 from the point of time "T1" till the point of time "T2" may be set as a time period for driving the first pre-charge voltage VBLP1 to the ground voltage VSS and for driving the second pre-charge voltage VBLP2 to the power supply voltage VDD.

At the point of time "T2", a counter (not illustrated) of the word line control circuit 70 may generate the first word line selection signal WLS<1> in response to the write initialization signal FZM having a logic "high" level.

The memory circuit 80 may activate the first word line WL<1> which is selected in response to the first word line selection signal WLS<1>. The memory circuit 80 may drive the first bit line BL1 and the first complementary bit line BLB1 of the first memory cell 81 connected to the first word line WL<1> to the first pre-charge voltage VBLP1. The memory circuit 80 may store a datum (having a level of the first pre-charge voltage VBLP1) loaded on the first bit line BL1 into the first memory cell 81. In such a case, the datum stored in the first memory cell 81 may have the ground voltage VSS which means a logic "low" level.

The memory circuit 80 may activate the first word line WL<1> which is selected in response to the first word line selection signal WLS<1>. The memory circuit 80 may drive the second bit line BL2 and the second complementary bit line BLB2 of the second memory cell 83 connected to the first word line WL<1> to the second pre-charge voltage VBLP2. The memory circuit 80 may store a datum (having a level of the second pre-charge voltage VBLP2) loaded on the second bit line BL2 into the second memory cell 83. In such a case, the datum stored in the second memory cell 83 may have the power supply voltage VDD which means a logic "high" level.

As described above, the first memory cell 81 may store a datum having a logic "low" level, and the second memory cell 83 may store a datum having a logic "high" level. That is, two different data having different logic levels may be stored into two adjacent memory cells to induce an inter-symbol interference phenomenon.

At the point of time "T3", a delay circuit (not illustrated) of the word line control circuit 70 may delay the first word line selection signal WLS<1> by a sum of the active period and the pre-charge period to generate the word line delay signal WLD.

A counter (not illustrated) of the word line control circuit 70 may generate the second word line selection signal WLS<2> in response to the word line delay signal WLD having a logic "high" level.

The memory circuit 80 may activate the second word line WL<2> which is selected in response to the second word line selection signal WLS<2>. The memory circuit 80 may drive a bit line (not illustrated) and a complementary bit line (not illustrated) of a first memory cell (not illustrated) connected to the second word line WL<2> to the first pre-charge voltage VBLP1. The memory circuit 80 may store a datum (having a level of the first pre-charge voltage VBLP1) loaded on the bit line (not illustrated) of the first memory cell (not illustrated) into the first memory cell (not illustrated). In such a case, the datum stored in the first memory cell (not illustrated) may have the ground voltage VSS which means a logic "low" level.

The memory circuit 80 may activate the second word line WL<2> which is selected in response to the second word line selection signal WLS<2>. The memory circuit 80 may drive a bit line (not illustrated) and a complementary bit line (not illustrated) of a second memory cell (not illustrated) connected to the second word line WL<2> to the second pre-charge voltage VBLP2. The memory circuit 80 may store a datum (having a level of the second pre-charge voltage VBLP2) loaded on the bit line (not illustrated) of the second memory cell (not illustrated) into the second memory cell (not illustrated). In such a case, the datum stored in the second memory cell (not illustrated) may have the power supply voltage VDD which means a logic "high" level.

As a result, the first memory cell (not illustrated) connected to the second word line WL<2> may store a datum having a logic "low" level, and the second memory cell (not illustrated) connected to the second word line WL<2> may store a datum having a logic "high" level. That is, two different data having different logic levels may be stored into two adjacent memory cells to induce an inter-symbol interference phenomenon.

The second period D2 from the point of time "T2" till the point of time "T3" may be set to correspond to a sum of the active period and the pre-charge period.

During a period from the point of time "T3" till the point of time "T4", the counter (not illustrated) of the word line control circuit 70 may sequentially count the third to sixteenth word line selection signals WLS<3:16>.

At the point of time "T4", the memory circuit 80 may activate the sixteenth word line WL<16> which is selected in response to the sixteenth word line selection signal WLS<16>. The memory circuit 80 may drive a bit line (not illustrated) and a complementary bit line (not illustrated) of a first memory cell (not illustrated) connected to the sixteenth word line WL<16> to the first pre-charge voltage VBLP1. The memory circuit 80 may store a datum (having a level of the first pre-charge voltage VBLP1) loaded on the bit line (not illustrated) of the first memory cell (not illustrated) connected to the sixteenth word line WL<16> into the first memory cell (not illustrated) connected to the sixteenth word line WL<16>. In such a case, the datum stored in the first memory cell (not illustrated) may have the ground voltage VSS which means a logic "low" level.

the memory circuit 80 may activate the sixteenth word line WL<16> which is selected in response to the sixteenth word line selection signal WLS<16>. The memory circuit 80 may drive a bit line (not illustrated) and a complementary bit line (not illustrated) of a second memory cell (not illustrated) connected to the sixteenth word line WL<16> to the second pre-charge voltage VBLP2. The memory circuit 80 may store a datum (having a level of the second pre-charge voltage VBLP2) loaded on the bit line (not illustrated) of the second memory cell (not illustrated) connected to the sixteenth word line WL<16> into the second memory cell (not illustrated) connected to the sixteenth word line WL<16>. In such a case, the datum stored in the second memory cell (not illustrated) may have the power supply voltage VDD which means a logic "high" level.

As a result, the first memory cell (not illustrated) connected to the sixteenth word line WL<16> may store a datum having a logic "low" level, and the second memory cell (not illustrated) connected to the sixteenth word line WL<16> may store a datum having a logic "high" level. That is, two different data having different logic levels may be stored into two adjacent memory cells to induce an inter-symbol interference phenomenon.

At the point of time "T5", a storage circuit (not illustrated) of the word line control circuit 70 may store the initialization end signal FZC which is enabled after the sixteenth word line selection signal WLS<16> is counted. The storage circuit (not illustrated) of the word line control circuit 70 may output the initialization end signal FZC stored therein.

As described above, a semiconductor device according to an embodiment may respectively drive a first pre-charge voltage and a second pre-charge voltage to a first external voltage and a second external voltage during an initialization operation and may respectively store two different data having levels of the first and second pre-charge voltages into two adjacent memory cells for a disturbance test inducing an inter-symbol interference between two different data.

Figure 11:
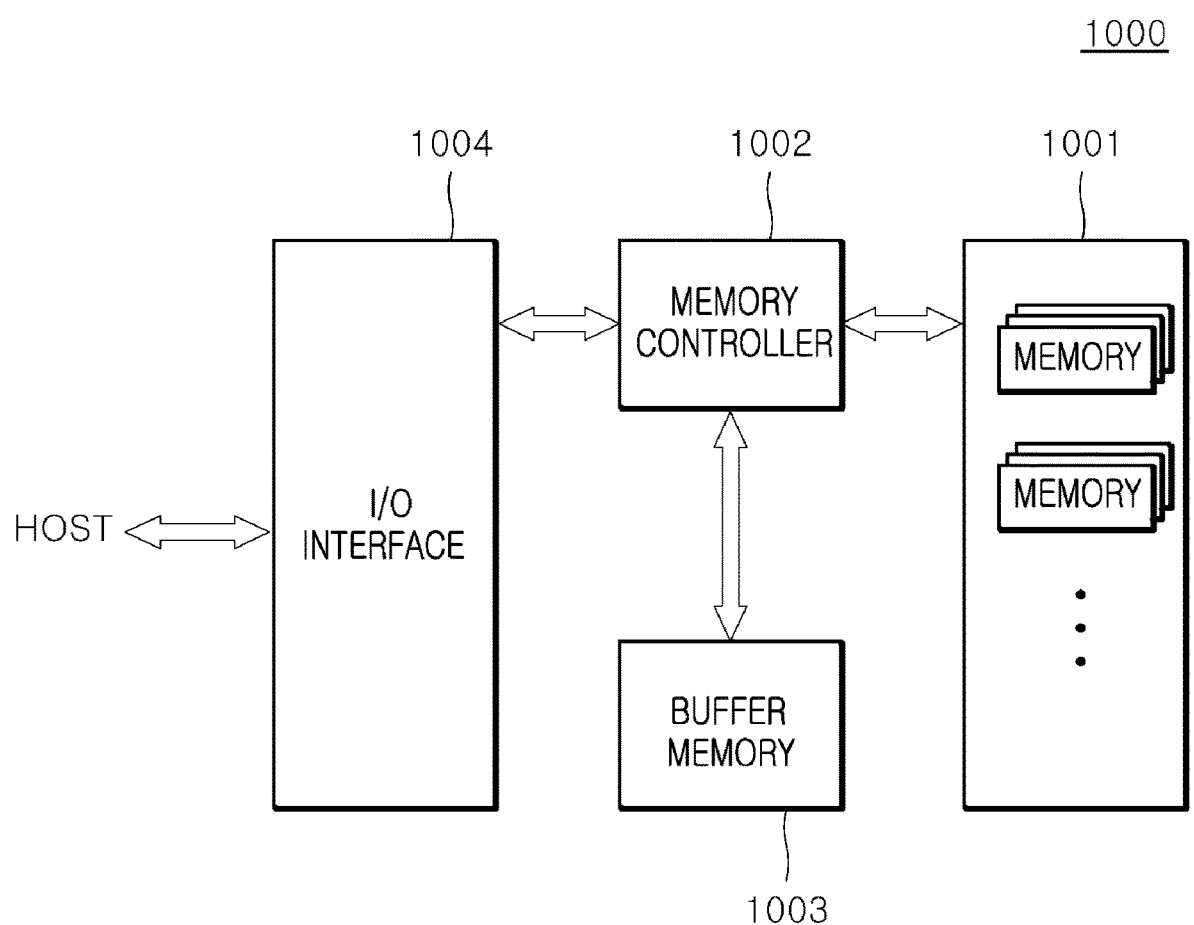
FIG. 11 is a block diagram illustrating a configuration of an electronic system employing at least one of the semiconductor devices illustrated in FIGS. 1 to 10.

At least one of the semiconductor devices described with reference to FIGS. 1 to 10 may be applied to an electronic system that includes a memory system, a graphic system, a computing system, a mobile system, or the like. For example, as illustrated in FIG. 11, an electronic system 1000 according an embodiment may include a data storage circuit 1001, a memory controller 1002, a buffer memory 1003, and an input/output (I/O) interface 1004.

The data storage circuit 1001 may store data which are outputted from the memory controller 1002 or may read and output the stored data to the memory controller 1002, according to a control signal generated by the memory controller 1002. The data storage circuit 1001 may include at least one of the semiconductor devices illustrated in FIGS. 1 and 8. Meanwhile, the data storage circuit 1001 may include a nonvolatile memory that can retain their stored data even when its power supply is interrupted. The nonvolatile memory may be a flash memory such as a NOR-type flash memory or a NAND-type flash memory, a phase change random access memory (PRAM), a resistive random access memory (RRAM), a spin transfer torque random access memory (STTRAM), a magnetic random access memory (MRAM), or the like.

The memory controller 1002 may receive a command outputted from an external device (e.g., a host device) through the I/O interface 1004 and may decode the command outputted from the host device to control an operation for inputting data into the data storage circuit 1001 and the buffer memory 1003 or for outputting the data stored in the data storage circuit 1001 and the buffer memory 1003. Although FIG. 11 illustrates the memory controller 1002 with a single block, the memory controller 1002 may include one controller for controlling the data storage circuit 1001 comprised of a nonvolatile memory and another controller for controlling the buffer memory 1003 comprised of a volatile memory.

The buffer memory 1003 may temporarily store the data to be processed by the memory controller 1002. That is, the buffer memory 1003 may temporarily store the data which are outputted from or to be inputted to the data storage circuit 1001. The buffer memory 1003 may store the data, which are outputted from the memory controller 1002, according to a control signal. The buffer memory 1003 may read and output the stored data to the memory controller 1002. The buffer memory 1003 may include a volatile memory such as a dynamic random access memory (DRAM), a mobile DRAM, or a static random access memory (SRAM). The buffer memory 1003 may include at least one of the semiconductor devices illustrated in FIGS. 1 and 8.

The I/O interface 1004 may physically and electrically connect the memory controller 1002 to the external device (i.e., the host). Thus, the memory controller 1002 may receive control signals and data supplied from the external device (i.e., the host) through the I/O interface 1004 and may output the data generated by the memory controller 1002 to the external device (i.e., the host) through the I/O interface 1004. That is, the electronic system 1000 may communicate with the host through the I/O interface 1004. The I/O interface 1004 may include any one of various interface protocols such as a universal serial bus (USB), a multi-media card (MMC), a peripheral component interconnect-express (PCI-E), a serial attached SCSI (SAS), a serial AT attachment (SATA), a parallel AT attachment (PATA), a small computer system interface (SCSI), an enhanced small device interface (ESDI) and an integrated drive electronics (IDE).

The electronic system 1000 may be used as an auxiliary storage device of the host or an external storage device. The electronic system 1000 may include a solid state disk (SSD), a USB memory, a secure digital (SD) card, a mini secure digital (mSD) card, a micro secure digital (micro SD) card, a secure digital high capacity (SDHC) card, a memory stick card, a smart media (SM) card, a multi-media card (MMC), an embedded multi-media card (eMMC), a compact flash (CF) card, or the like.

What is claimed is:

1. A semiconductor device comprising:
   a power supply circuit configured to drive a pre-charge voltage to a level of an external voltage based on a write initialization signal which is enabled if a command has a predetermined level combination;
   a word line control circuit configured to generate two or more word line selection signals that are sequentially counted based on the write initialization signal
   wherein the word line control circuit includes:
   a counter configured to generate a word line selection signals which are sequentially counted based on a word line delay signal if the write initialization signal is enabled;
   a delay circuit configured to delay a selected one of the word line selection signals by a sum of an active period and a pre-charge period to generate the word line delay signal;
   a storage circuit configured to store an initialization end signal which is enabled if all of the word line selection signals are sequentially counted once and configured to output the initialization end signal; and
   a memory circuit configured to sequentially select a plurality of word lines based on the word line selection signals, configured to drive bit lines of memory cells connected to the selected word line to the pre-charge voltage, and configured to store data, which are loaded on the bit lines to have a level of the pre-charge voltage, into the memory cells connected to the selected word line.

2. The semiconductor device of claim 1, wherein the external voltage is set to be a ground voltage.

3. The semiconductor device of claim 1, wherein the write initialization signal is a signal that activates an initialization operation for writing the data having a level of the external voltage into the memory cells.

4. The semiconductor device of claim 1, wherein the memory circuit stores data having a same logic level into the memory cells connected to each of the plurality of word lines.

5. The semiconductor device of claim 1, wherein the memory circuit includes a switch circuit which is configured to supply the pre-charge voltage to the bit lines based on an equalization signal.

6. The semiconductor device of claim 5, wherein the switch circuit includes:
- a first switch circuit configured to electrically connect a first bit line of the bit lines to a first complementary bit line based on the equalization signal and configured to apply the pre-charge voltage to the first bit line and the first complementary bit line; and
- a second switch circuit configured to electrically connect a second bit line of the bit lines to a second complementary bit line based on the equalization signal and configured to apply the pre-charge voltage to the second bit line and the second complementary bit line.

7. The semiconductor device of claim 6, wherein the first switch circuit includes:
- a first equalization circuit configured to electrically connect the first bit line to the first complementary bit line if the equalization signal is enabled and configured to apply the pre-charge voltage to the first bit line and the first complementary bit line; and
- a first sense amplifier configured to sense and amplify a voltage difference between the first bit line and the first complementary bit line.

8. The semiconductor device of claim 6, wherein the second switch circuit includes:
- a second equalization circuit configured to electrically connect the second bit line to the second complementary bit line if the equalization signal is enabled and configured to apply the pre-charge voltage to the second bit line and the second complementary bit line; and
- a second sense amplifier configured to sense and amplify a voltage difference between the second bit line and the second complementary bit line.

* * * * *